Jan. 12, 1971 F. KRIEGER 3,554,793
METHOD OF APPLYING A DISCRETE LAYER OF METALLIC SUBSTANCE OVER A METAL PATTERN ON AN INSULATING CARRIER
Filed Feb. 20, 1968
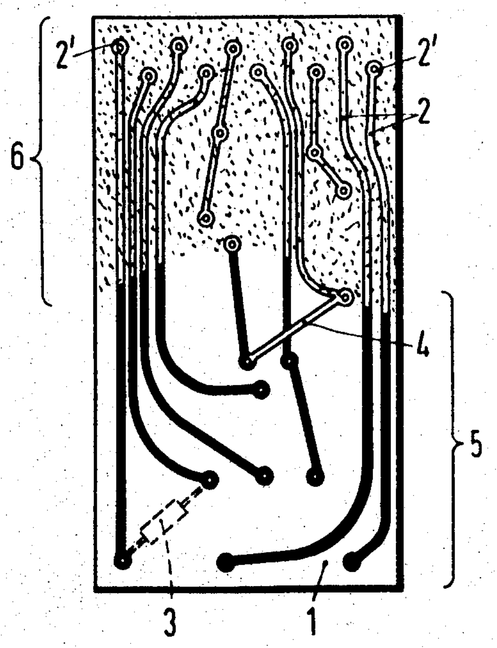

United States Patent Office 3,554,793
Patented Jan. 12, 1971

3,554,793

METHOD OF APPLYING A DISCRETE LAYER OF METALLIC SUBSTANCE OVER A METAL PATTERN ON AN INSULATING CARRIER

Friedrich Krieger, Gilching, Germany, assignor to Siemens Aktiengesellschaft

Filed Feb. 20, 1968, Ser. No. 706,979
Claims priority, application Germany, Feb. 24, 1967, S 108,491
Int. Cl. B41m *3/08;* H05k *3/02*
U.S. Cl. 117—212 12 Claims

ABSTRACT OF THE DISCLOSURE

Soldering material is sprayed over an electrical circuit pattern positioned on an insulating carrier. The solder is in the liquid state, but is below the temperature at which the solder forms an alloy with the metal circuit pattern. The layer of solder is then heated to its alloying temperature causing the solder to contract, by surface tension, onto the metal circuit pattern forming an alloy therewith and leaving the insulating carrier substantially free of solder, which could cause a short circuit.

BACKGROUND OF THE INVENTION

Methods of tinning or soldering metallic conductor paths of printed circuit boards have been known in the past wherein the surface containing the conductor paths is placed over a fountain of liquid soldering material in such a way that the peak of the fountain comes in contact with the board surface. This method has the disadvantage, due to the fluctuations in the height of the fountain resulting from the turbulence of the liquid solder, that an even coating of solder is not guaranteed on the conductor paths. Another disadvantage resides in the fact that the solder forms bridges between very closely located conductor paths. There is also the problem that the openings in the conductor paths, which are later to serve for the connection of electrical components, are in most cases clogged up with the solder thereby making subsequent installation of the components in the circuit board very difficult or even impossible. Furthermore, where the object to be soldered or tinned, for example a copper conductor is brought into contact with the solder bath, the correct composition of the solder bath changes due to the deposit of foreign metal parts. This necessitates that the solder baths be regenerated and cleaned after only a relative short period of use.

These disadvantages are avoided in part in other known methods, for example the sprinkle or spray method, wherein liquid metal such as tin is sprayed with the aid of a spray gun onto the entire surface of the plate having a circuit pattern positioned in channels or indentations on the plate. After cooling, the excess solder must be removed by polishing or abrading the plate so that only the conductor path remains in the channels or indentations. This method requires a great expenditure of time and manpower in order to remove the excess metal. Moreover, this method is not suitable for tinning or soldering existing metal patterns, for example conductor paths, because of the great distance of air which must be covered by the liquid solder from the solder bath to the object being soldered, thus not guaranteeing the formation of an acceptable alloy.

SUMMARY

The invention relates to a method of applying a metallic layer over a metal pattern which is mounted on a carrier of insulating material. Initially, an even layer of the metallic substance is adhered to the metallic pattern and the insulating carrier, the metallic substance having a temperature below that at which the metallic substance and the metal pattern form an alloy. The metallic substance is then heated to its alloying temperature so that the metallic substance contracts, by surface tension, onto the metal pattern and forms an alloy therewith and leaves the insulating carrier substantially free of the metallic substance.

In the preferred embodiment the metallic layer is composed of a soldering or tinning material and the metal pattern is suitable for use as an electrical circuit having various circuit paths. Also, the insulating carrier and the circuit pattern may be provided with holes in which are mounted the terminals of electrical components which are simultaneously soldered to the insulating carrier by the formation of the alloy.

The method results in the removal of substantially all of the solder from the insulating carrier thereby preventing a short circuit between the various circuit paths. The method also alleviates the problem of clogging the holes in the insulating carrier through which electrical components may be subsequently inserted. Furthermore, the method provides an economical way of placing a protective coating on a circuit path which readily lends itself to automation and avoids the aforementioned disadvantages of the prior art.

DRAWING

Other objects, advantages, and aspects of the invention will become apparent by reference to the following detailed description and drawing thereof, wherein:

In the drawing there is shown a printed circuit board during various stages of the subject inventive method.

DETAILED DESCRIPTION OF THE INVENTION

In the drawing there is shown a carrier 1 made of insulating material, having a metal pattern 2 thereon. By way of example and not limitation, the carrier 1 is shown as a circuit board having circuit paths 2 connected to the surface thereof. The circuit paths 2 may be applied to the carrier 1 by known etching processes. It is desired to coat the circuit paths 2 with a protective metal layer which will be hereinafter referred to as tin or solder, for exemplary purposes. At the same time, it is possible to connect the terminals of an electrical component 3 as well as the bent ends of a wire bridge 4 to the ends 2′ of the circuit paths 2. The ends 2′ are enlarged areas having openings into which may be placed the leads or terminals of the components 3 and wire bridges 4 for firmly connecting the elements to the circuit board 1.

It is preferable, prior to carrying out the method according to the invention, to clean the entire surface of the circuit board 1 and the conductor paths 2 in order to remove dirt and/or oxide particles. After the surface has been cleaned, an even layer of solder, for example, is applied to the entire surface of the insulating circuit board 1 and the circuit paths 2. This can be done, for example, by means of a spray gun. The temperature of the solder when it reaches the circuit board 1 and the circuit paths 2 must be controlled so that upon application no alloy is formed between the solder and the metal circuit paths 2. Thus, there results a porous layer of solder which has previously cooled to a point below its alloy-forming temperature, this layer being indicated in the drawing by the dotted area designated 6.

At this point it is desirable to apply a liquid flux agent to the layer 6 by means, for example, of a spraying device. The flux agent seeps through the porous layer 6 until it reaches the circuit paths 2 and 2'.

The next step of the process is to heat the entire layer 6 of solder by a flame, for example, to a temperature at which the layer 6 forms an alloy with the material of the metal circuit paths 2 and 2'. The temperature at which the solder forms an alloy of course varies depending upon the exact composition of the solder and the circuit paths.

In the drawing the area designated 5 of the circuit board 1 has already undergone such a heat treatment. The solder which was distributed over the entire surface of the circuit board 1 has contracted sharply, due to surface tension, so that it lies exclusively on the metal circuit paths 2 and 2' where it forms the desirable alloy. At the same time the terminals of the electrical component 3 and the wire bridge 4 which are in the openings at the end portions 2' are firmly soldered in position to the circuit paths.

The contracting of the solder exclusively onto the circuit paths is explained by the surface tension of the solder which increases as the temperature increases and which causes a flow of the solder into the direction of the metallic object to be soldered. Tests have proven that the solder applied as an even layer on the circuit board 1, at a temperature below that at which an alloy is formed, may also travel over extended distances, namely between adjacent circuit paths. This is possible because the solder only adheres to the surface of the circuit board 1 and does not "wet" the surface, as the expression is used in the art of soldering, of either the insulating material or the metal portions.

This method, as compared to known methods, has the advantage that the solder may be applied by simply spraying, spreading or scattering the solder onto the surface and no attention needs to be paid to the places which are not to be covered. Also, when it is desired to form an alloy, the kind of heat source may be either a flame or hot air or radiant heat. In any event the method reliably covers the metal circuit paths 2 and 2' while leaving the circuit board 1 free of solder. This, of course, eliminates the formation of bridges between the various circuit paths and also eliminates the clogging of the openings in the end portions 2'. Another advantage results from the fact that a flux agent may be applied by any simple means to the porous layer of solder. The flux agent then seeps through the solder layer and completely removes any oxides which may still be on the metal circuit paths.

It is to be understood that this method is not limited to tinning or soldering the metallic surfaces. Also, the method is successful where the surfaces are at an angle to each other, for example in the case of the metal wall surfaces of the openings in the circuit board 1. The surface tension is also sufficient to cause the solder to surround the leads of the electrical components which may be protruding out of the plane of the circuit board 1.

Plates which have been treated by the subject method, according to the invention can easily be stored for extended periods of time since the layer of solder covering the metal circuit paths can be applied in almost any thickness, as contrasted to the known methods, for example the etching method. This permits the assembling of the board with electrical components at a later time, if desired, without further preparation of the surfaces of the circuit board 1 and its metal circuit paths 2 and 2'.

It is also advantageous to use a reducing or deoxidizing, combustible gas for heating the layer 6 thereby further assisting the effectiveness of the flux agent.

Use of the above described method also makes it possible to equip a circuit board having etched conductor paths with electrical components on the side containing the conductor paths by simply heating the circuit board after the board has been treated in accordance with the above described process.

Furthermore, it is possible in certain circumstances to cover particular metallic portions on the circuit board prior to the application of the layer of solder, such as with masks or templates. Since no solder subsequently adheres to these portions of the metal surface there can be no movement of the solder layer in the direction of these metal portions, and thus they remain bare.

It is to be understood that the invention is not limited to the particular embodiments and features described and shown, but that it comprises any modifications and equivalents within the scope of the appended claims.

I claim:

1. A method of applying a metallic layer over a metal pattern mounted on a carrier of insulating material which comprises the steps of:

adhering a layer of a metallic substance (6) over the metal pattern (2, 2') and the insulating carrier (1), said metallic substance having a temperature below that at which the metallic substance and the metal pattern form an alloy, and then heating the metallic substance to its alloying temperature so that the metallic substance contracts onto the metal pattern and forms an alloy therewith and leaves the insulating carrier substantially free of the metallic substance.

2. A method as recited in claim 1 wherein the metallic substance is a soldering material.

3. A method as recited in claim 1 wherein the metallic layer is applied by spraying the metallic substance onto the metal pattern and insulating carrier.

4. A method as recited in claim 1 which further includes applying a flux agent to the layer of metallic substance before heating to the alloying temperature.

5. A method as recited in claim 1 wherein the heating of the layer of metallic substance is carried out with a reducing, combustible gas.

6. A method as recited in claim 1 wherein said metal pattern is suitable for use as an electrical circuit and wherein said heating of the layer of metallic substance is of a sufficient intensity and duration to remove all of the metallic substance from the insulating carrier which could short circuit any of the circuit paths.

7. A method of applying a layer of soldering material over a metal pattern positioned on a carrier of insulating material and simultaneously connecting electrical components to the carrier, said components having metal terminals extending through said pattern and carrier, which comprises the steps of:

adhering an even layer of soldering material (6) over the metal pattern (2, 2') and insulating carrier (1), said soldering material having a temperature below that at which it and the metal pattern form an alloy, and then heating the soldering material to its alloying temperature so that the soldering material contracts onto the metal pattern and around the metal terminals of the components and forms an alloy therewith leaving the insulating carrier substantially free of the soldering material.

8. A method as recited in claim 7 wherein the soldering material is applied by spraying the solder onto the metal pattern and insulating carrier.

9. A method as recited in claim 7 which further includes applying a flux agent to the layer of soldering material before heating to the alloying temperature.

10. A method as recited in claim 7 wherein the heating of the layer of soldering material is carried out with a reducing, combustible gas.

11. A method as recited in claim 7 wherein said metal pattern is suitable for use as an electrical circuit and wherein said heating of the layer of soldering material is of a sufficient intensity and duration to remove all of the soldering material from the insulating carrier which could short circuit any of the circuit paths.

12. A method as recited in claim 7 which further comprises the step of masking a portion of the metal pattern prior to the adhering of the layer of soldering material to maintain that portion free of the soldering material.

References Cited

UNITED STATES PATENTS

| | | | |
|---|---|---|---|
| 1,582,668 | 4/1926 | Dreifus | 117—46 |
| 1,614,662 | 1/1927 | Dickens | 117—46 |
| 2,327,437 | 8/1943 | Kronquest | 29—497X |
| 2,740,193 | 4/1956 | Pessel | 29—497X |
| 3,293,065 | 12/1966 | Roetter | 117—46 |
| 3,386,166 | 6/1968 | Tardoskegi | 29—625 |

ALFRED L. LEAVITT, Primary Examiner

A. GRIMALDI, Assistant Examiner

U.S. Cl. X.R.

117—217; 29—625